(12) United States Patent
Sechrist et al.

(10) Patent No.: US 9,088,140 B2
(45) Date of Patent: Jul. 21, 2015

(54) GUIDE FEATURES FOR A CABLE BACKPLANE SYSTEM

(71) Applicant: Tyco Electronics Corporation, Berwyn, PA (US)

(72) Inventors: Joshua Tyler Sechrist, Etters, PA (US); Christopher David Ritter, Hummelstown, PA (US); Nathan Glenn Lehman, Harrisburg, PA (US); Brian Patrick Costello, Scotts Valley, CA (US); Robert Paul Nichols, Vacaville, CA (US)

(73) Assignee: Tyco Electronics Corporation, Berwyn, PA (US)

(*) Notice: Subject to any disclaimer, the term of this patent is extended or adjusted under 35 U.S.C. 154(b) by 119 days.

(21) Appl. No.: 13/911,297

(22) Filed: Jun. 6, 2013

(65) Prior Publication Data
US 2014/0360753 A1    Dec. 11, 2014

(51) Int. Cl.
*H02G 3/10* (2006.01)
*H02B 11/00* (2006.01)
*H04Q 1/00* (2006.01)
*H05K 5/00* (2006.01)

(52) U.S. Cl.
CPC .............. *H02B 11/00* (2013.01); *H04Q 1/00* (2013.01); *H05K 5/00* (2013.01)

(58) Field of Classification Search
CPC ........... H02B 11/00; H04Q 1/00; H05K 5/00; H02G 3/10
USPC ................ 174/50; 361/829; 211/26, 182; 312/223.1
See application file for complete search history.

(56) References Cited

U.S. PATENT DOCUMENTS

| 8,237,052 B2* | 8/2012 | Adducci et al. ................. 174/50 |
| 8,395,046 B2* | 3/2013 | Nicewicz et al. ............... 174/50 |
| 8,655,137 B2* | 2/2014 | Baldassano et al. .......... 385/135 |

* cited by examiner

*Primary Examiner* — Dhirubhai R Patel

(57) ABSTRACT

A cable backplane system includes a backplane having a plurality of openings therethrough. A cable rack is coupled to a rear of the backplane, which includes a tray and spacers coupled to the tray that have guide pins. Cable connector assemblies are held by the tray. Removable dust caps are coupled to corresponding cable connectors each having a distal end and guide walls extending therefrom that guide mating of the cable rack with the backplane. The distal end of each dust cap is received in a corresponding opening in the backplane. The guide walls guide the cable rack relative to the backplane such that the guide pins of the spacers are aligned with guide holes of the backplane and such that the cable connectors are aligned with the openings of the backplane. The removable dust caps are removed after the cable rack is coupled to the backplane.

20 Claims, 10 Drawing Sheets

GUIDE FEATURES FOR A CABLE BACKPLANE SYSTEM

BACKGROUND OF THE INVENTION

The subject matter herein relates generally to guide features for a cable backplane system.

Communication systems, such as network systems, servers, data centers, and the like, use large printed circuit boards, known as backplanes, to interconnect midplanes, daughtercards, line cards and/or switch cards. The communication systems use high speed differential connectors mounted to the backplane and high speed differential connectors mounted to the line cards and switch cards to transmit signals therebetween. The backplane interconnects the various connectors using traces along the circuit board.

As the density of the systems increase and requirements for high speed lines increase, the printed circuit boards continue to become larger and the signal integrity inherently degrades as the signals travel further along the entire channel. At least some systems have replaced the traditional backplanes with cable assemblies. However, packaging of large numbers of cable assemblies is difficult. Cable management is a limiting factor in such systems. Additionally, assembly of such systems with the large number of cables is problematic. Holding the cable connectors in proper position for mating with the line and switch cards is difficult.

A need remains for a cable backplane system that may be assembled in a cost effective and reliable manner.

BRIEF DESCRIPTION OF THE INVENTION

In one embodiment, a cable backplane system includes a backplane having a plurality of openings therethrough and a plurality of mounting blocks on a front of the backplane with guide holes proximate to the openings. A cable rack is coupled to a rear of the backplane. The cable rack includes a tray having a frame surrounding a raceway and spacers coupled to the tray that have guide pins received in corresponding guide holes in the backplane. Cable connector assemblies are held by the tray and have a plurality of cables extending between at least two cable connectors with the cables routed in the raceway and the cable connectors positioned between and supported by corresponding spacers on opposite sides of the cable connectors. The cable connectors are received in corresponding openings in the backplane. Removable dust caps are coupled to corresponding cable connectors. The removable dust caps each having a distal end and guide walls extending from the distal end. The guide walls guide mating of the cable rack with the backplane. The distal end of each dust cap is received in a corresponding opening in the backplane. The guide walls guide the cable rack relative to the backplane such that the guide pins of the spacers are aligned with the guide holes of the backplane and such that the cable connectors are aligned with the openings of the backplane. The removable dust caps are removed after the cable rack is coupled to the backplane.

In another embodiment, a cable rack for a cable backplane system is provided that includes a tray having a frame surrounding a raceway and spacers coupled to the tray. The spacers have guide pins configured to align the spacers to a backplane in guide holes of the backplane. Cable connector assemblies are held by the tray and each have a plurality of cables extending between at least two cable connectors. The cables are routed in the raceway and the cable connectors are positioned between and supported by corresponding spacers on opposite sides of the cable connectors. The cable connectors are configured to be received in corresponding openings in the backplane. Removable dust caps are coupled to corresponding cable connectors. The removable dust caps each have a base and a handle extending from the base to a distal end with tapered guide walls extending between the base and the distal end. The guide walls guide mating of the cable rack with the backplane. The removable dust caps are removable after the cable rack is coupled to the backplane.

DETAILED DESCRIPTION OF THE INVENTION

Figure 1:
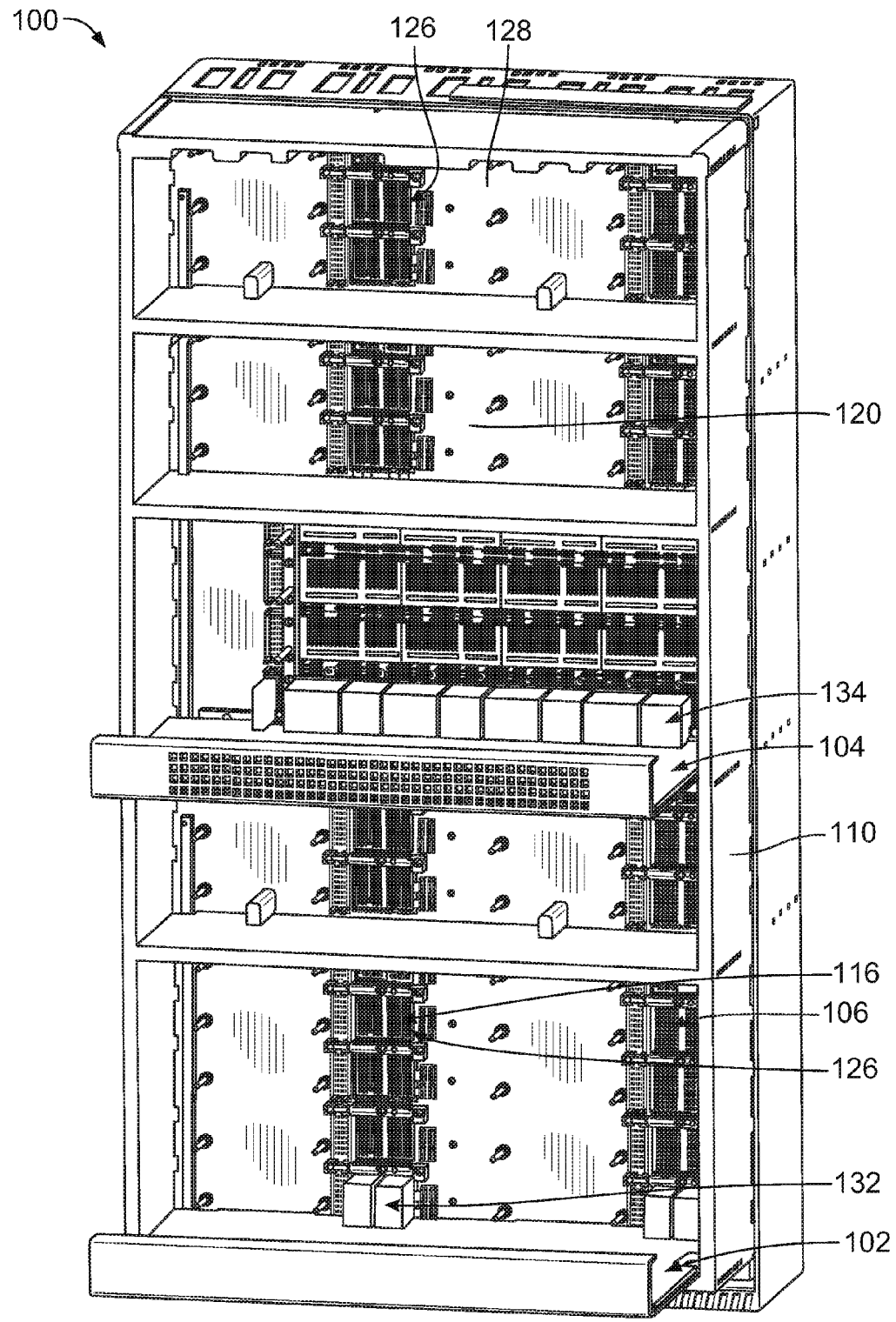
FIG. 1 is a front perspective view of a cable backplane system formed in accordance with an exemplary embodiment.
Figure 2:
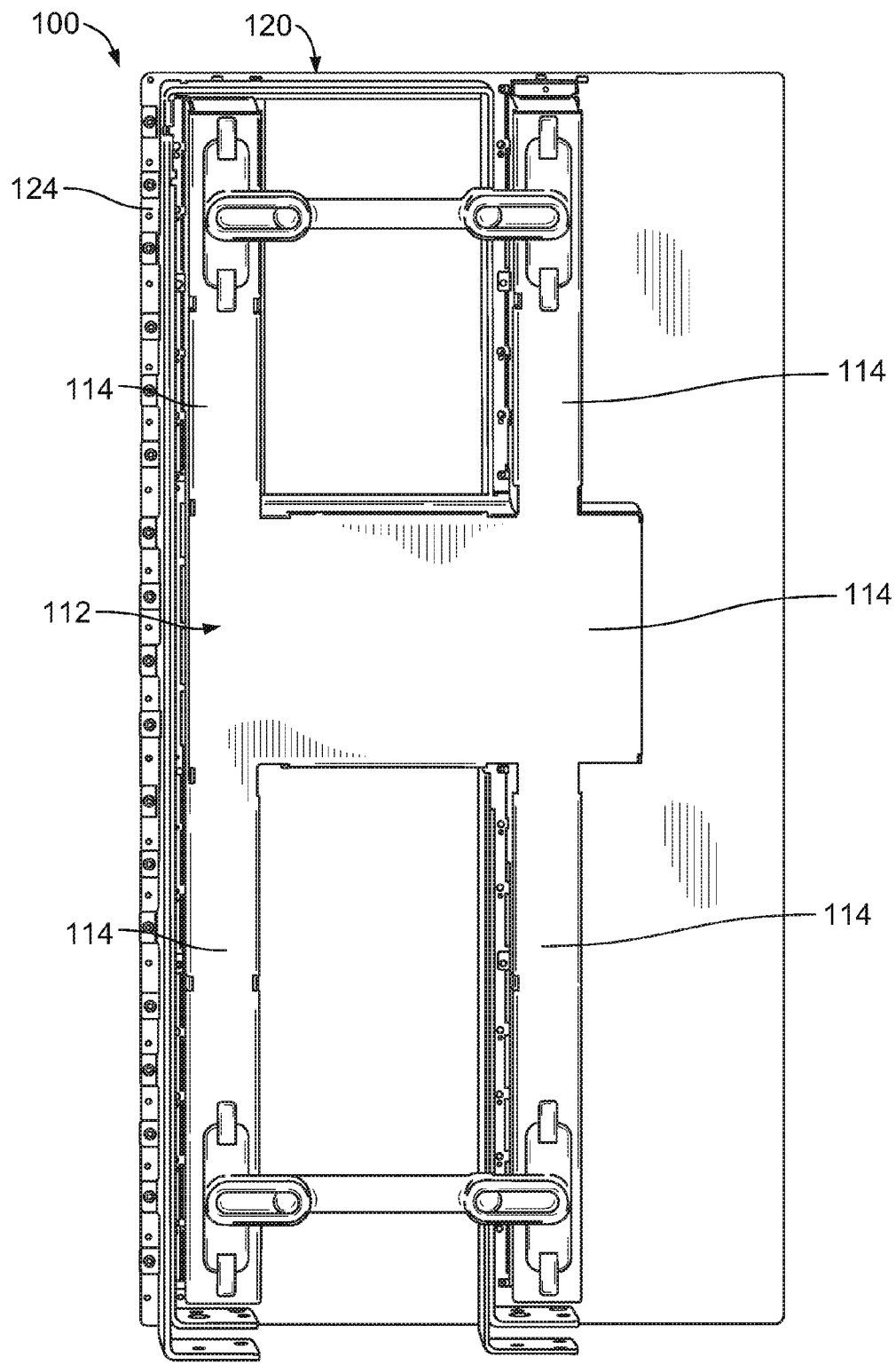
FIG. 2 is a rear perspective view of the cable backplane system.

FIG. 1 is a front perspective view of a cable backplane system 100 formed in accordance with an exemplary embodiment. FIG. 2 is a rear perspective view of the cable backplane system 100. The cable backplane system 100 is used in a data communication application, such as a network switch. The cable backplane system 100 interconnects line cards 102 and switch cards 104 using cable connector assemblies 106. The cable backplane system 100 may be used to interconnect with other types of connectors and/or cards, such as daughtercards, in other embodiments.

The cable connector assemblies 106 include cable connectors 116 that are interconnected by cables within the cable backplane system 100. The cable connector assemblies 106 eliminate interconnections via traces of a circuit board, such as a backplane circuit board. The cable connector assemblies 106 have improved signal performance along the signal paths between various connectors of the cable backplane system 100 as compared to conventional backplanes. The cable connector assemblies 106 support higher speeds, longer signal path lengths and lower cost per channel as compared to conventional backplanes. The cable connector assemblies 106 provide shielding of signal lines for improved signal performance. The cable connector assemblies 106 are packaged in a structure that allows accurate cable and connector location for mating with the corresponding line cards 102 and switch cards 104.

The cable backplane system 100 includes a chassis 110 that supports the components of the cable backplane system 100. The chassis 110 may include a rack, a cabinet or other suitable structures for holding the components of the cable backplane system 100. The chassis 110 may include structures for guiding, supporting and/or securing the lines cards 102 and switch cards 104 coupled to the cable backplane system 100.

The cable backplane system 100 includes a cable rack 112 that supports and/or manages the cables of the cable connector assemblies 106. The cable rack 112 includes a plurality of trays 114 that are held together and extend along different portions of the cable backplane system 100. The trays 114 may be box-shaped and define raceways for the cables. The cable rack 112 supports a plurality of the cable connectors 116 which form parts of the cable connector assemblies 106.

The cable backplane system 100 includes a backplane 120. The backplane 120 may be a circuit board and may be manufactured from typical circuit board material, such as FR-4 material. Electrical components, such as power supplies, fans, connectors, and the like may be attached to the backplane 120. Such electrical components may be electrically connected to traces of the backplane 120.

The backplane 120 and cable rack 112, with the cable connector assemblies 106, are coupled together to form the cable backplane system 100. The cable rack 112 is provided along a rear 124 of the backplane 120. The cable connectors 116 extend through openings 126 in the backplane 120 and are presented at a front 128 of the backplane 120 for mating with the line and switch cards 102, 104. The cable connectors 116 are not electrically connected to the backplane 120, as is typical of conventional backplanes, but rather the cable connectors 116 are interconnected by cables extending between the cable connectors 116.

In an exemplary embodiment, the cable rack 112 is flexible to allow the cable connectors 116 to align with and pass through the openings 126. Optionally, portions of the trays 114 may pass through the openings 126 with the cable connectors 116. The trays 114 may float relative to each other to properly align the cable connectors 116 with the corresponding openings 126. The backplane 120 holds the cable connectors 116 in precise locations for mating with the line and switch cards 102, 104. The backplane 120 has tight tolerances to control mating with the line and switch cards 102, 104. The cable rack 112 is flexible to allow the trays 114 to be properly aligned relative to the backplane 120. In an exemplary embodiment, guide features are provided for guiding assembly of the cable backplane system 100. For example, removable dust caps 600 (shown in FIG. 8) are used during assembly to guide the trays 114 and cable connectors 116 into the openings 126 in the backplane 120. In an exemplary embodiment, the cable connectors 116 float relative to one another and relative to the trays 114 to allow precise positioning of the cable connectors 116 relative to the backplane 120 for mating with the line and switch cards 102, 104. The line and switch cards 102, 104 have card connectors 132, 134, respectively, that mate with corresponding cable connectors 116. The cable connectors 116 need to be precisely positioned relative to the backplane 120 for mating with corresponding card connectors 132, 134.

Figure 3:
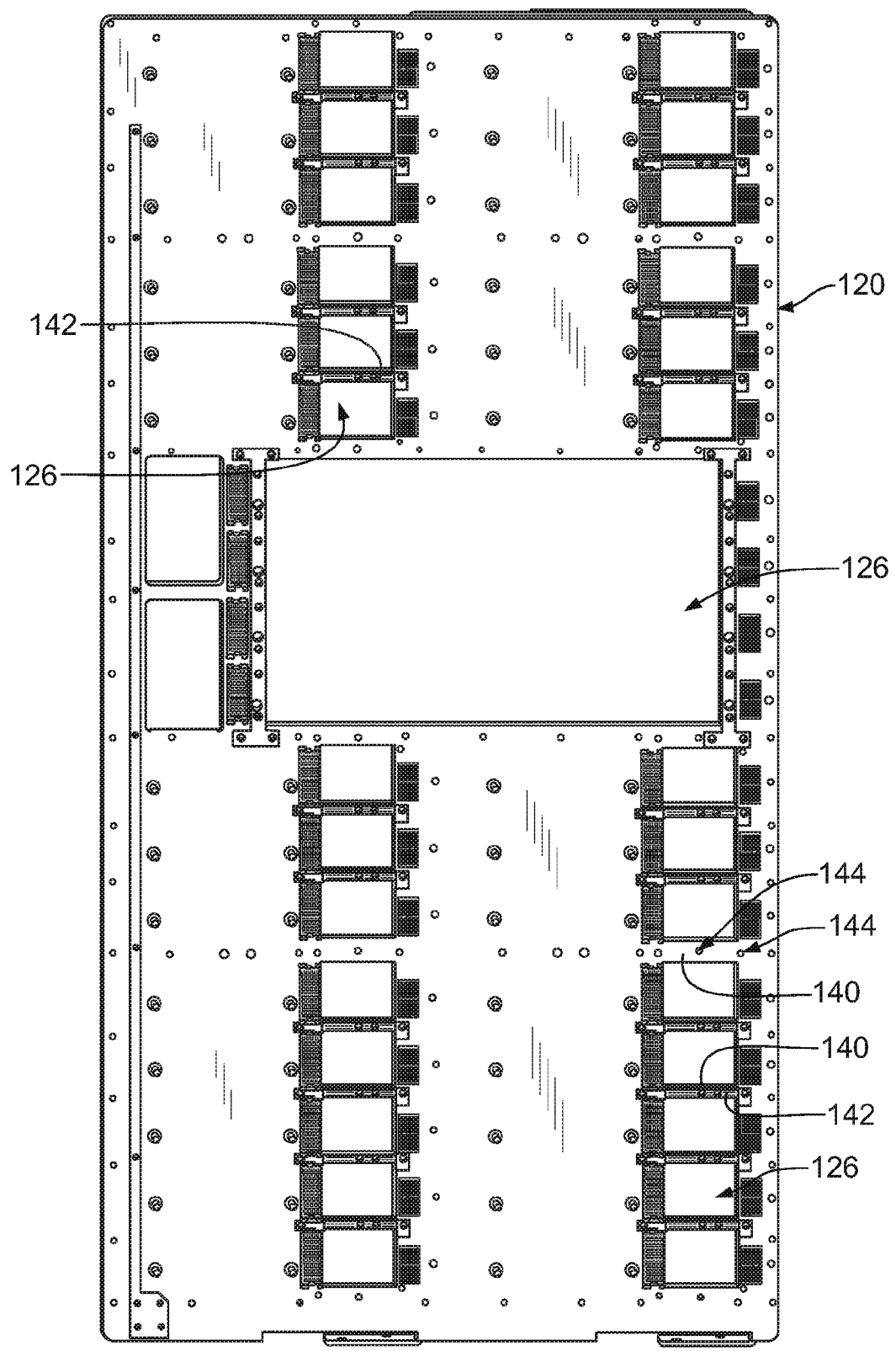
FIG. 3 illustrates a backplane of the cable backplane system and formed in accordance with an exemplary embodiment.

FIG. 3 illustrates the backplane 120 formed in accordance with an exemplary embodiment. The backplane 120 includes the openings 126 that receive the cable connectors 116 and/or portions of the trays 114 (both shown in FIG. 1). The openings 126 may be single openings that receive single cable connectors 116, such as the cable connectors 116 associated with the line cards 102 (shown in FIG. 1). The openings 126 may be large openings that receive multiple cable connectors 116, such as the cable connectors associated with the switch cards 104 (shown in FIG. 1).

The backplane 120 includes crossbars 140 between adjacent openings 126. The crossbars 140 provide support for the backplane 120. The crossbars 140 provide a mounting location for mounting blocks 142 (examples of which are shown mounted to the backplane 120 for reference) used to secure the cable connectors 116 to the backplane 120. Optionally, mounting blocks 142 may be provided at each crossbar 140. Mounting blocks 142 may be provided adjacent each opening 126. The crossbars 140 may define stiffeners for the mounting blocks 142 during assembly of the cable backplane system 100 (shown in FIG. 1). The mounting blocks 142 may be metal stiffeners separately fabricated from the backplane 120 and attached to the backplane 120. Alternatively, the mounting blocks 142 may be part of the backplane 120. For example, the mounting blocks 142 may be defined by an opening through the backplane 120 and the area of the backplane 120 around such opening. The opening may be threaded. The backplane 120 may be thicker in the area of the mounting block 142 to add rigidity to the backplane 120 in such area.

The backplane 120 includes holes 144 therethrough that receive guide features, fasteners or other components used to assembly the cable backplane system 100. The backplane 120 may include component openings 146 therethrough that receive other electrical components that are attached to the backplane 120. Some electrical components may be surface mounted to the backplane 120.

Figure 4:
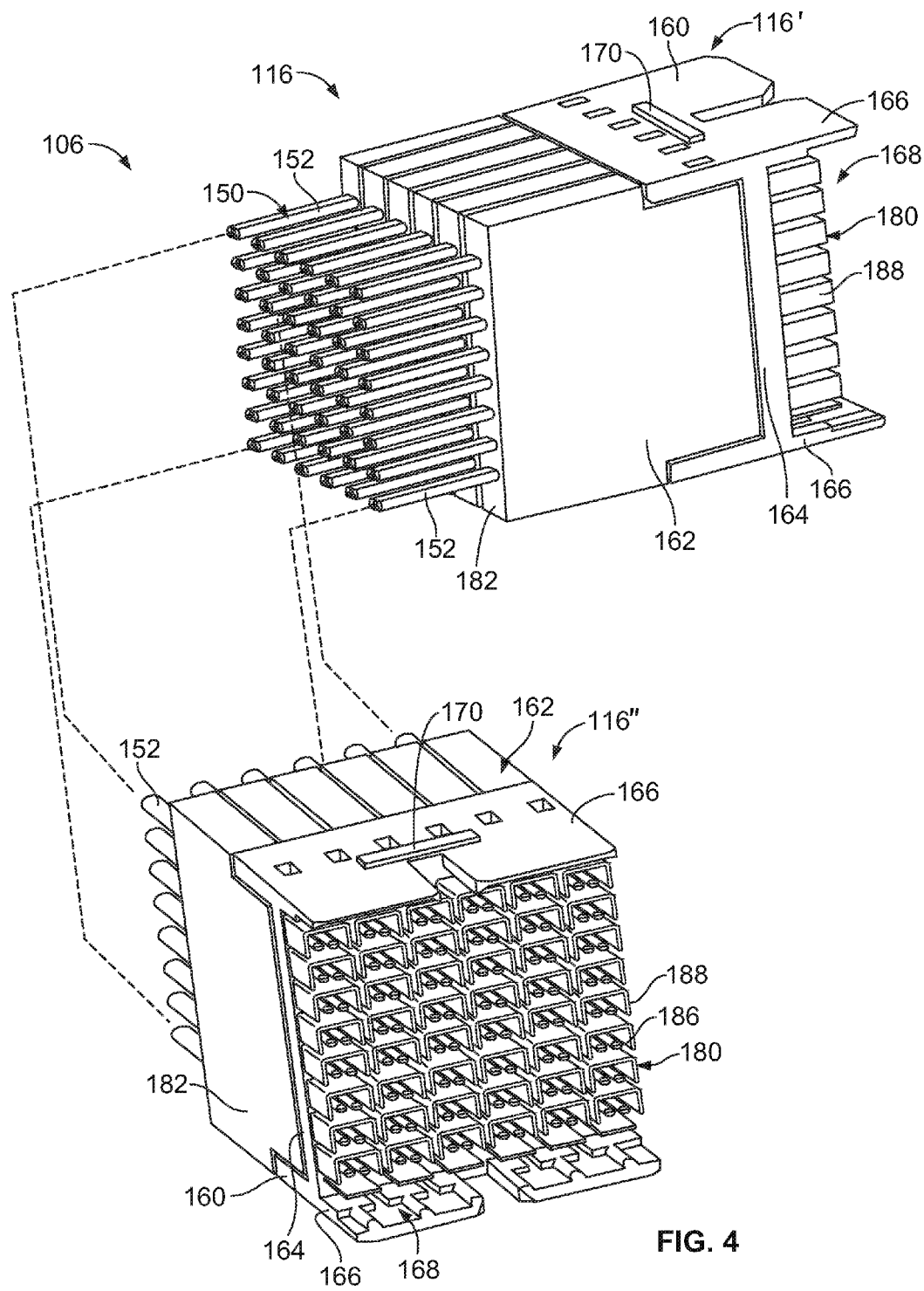
FIG. 4 illustrates a cable connector assembly of the cable backplane system and formed in accordance with an exemplary embodiment.

FIG. 4 illustrates a cable connector assembly 106 formed in accordance with an exemplary embodiment. The cable connector assembly 106 includes a plurality of the cable connectors 116, which may be referred to hereinafter as first and second cable connectors 116', 116'', and a cable bundle 150 between the cable connectors 116. The cable connectors 116 are provided at ends of the cable bundle 150. The cable bundle 150 includes a plurality of cables 152. Optionally, the first cable connector 116' may be connected to a card connector 132 (shown in FIG. 1) of a line card 102 (shown in FIG. 1) and the second cable connector 116'' may be connected to a card connector 134 (shown in FIG. 1) of the switch card 104 (shown in FIG. 1).

Optionally, the cable connectors 116 may be identical to one another. The cable connectors 116 may define header connectors. The cable connectors 116 are configured to be mated with corresponding card connectors 132, 134, which may be receptacle connectors, such as STRADA Whisper receptacle connectors, commercially available from TE Connectivity, Harrisburg, Pa. In an exemplary embodiment, the cable connector 116 is a high speed differential pair cable connector that includes a plurality of differential pairs of conductors mated at a common mating interface. The differential conductors are shielded along the signal paths thereof to reduce noise, crosstalk and other interference along the signal paths of the differential pairs.

In an exemplary embodiment, the cables 152 are twin axial cables having two signal wires within a common jacket of the cable 152. The signal wires convey differential signals. In an exemplary embodiment, the signal wires are shielded, such as with a cable braid of the cable 152. Optionally, each of the signal wires may be individually shielded. Other types of cables 152 may be provided in alternative embodiments. For example, coaxial cables may extend from the cable connector 116 each carrying a single signal conductor therein.

The cable connector 116 includes a header housing 160 holding a plurality of contact modules 162. The header housing 160 includes a base wall 164 and shroud walls 166 extending from the base wall 164 to define a mating cavity 168 configured to receive the corresponding card connector 132, 134. The shroud walls 166 guide mating of the card connector 132, 134 with the cable connector 116. In an exemplary embodiment, the header housing 160 has lugs 170 extending outward from the walls 166. The lugs 170 are used to locate the cable connector 116 with respect to the corresponding tray 114 (shown in FIG. 2).

Each of the contact modules 162 includes a plurality of cable assemblies 180 held by a support body 182. Each cable assembly 180 includes a pair of signal contacts 186 terminated to corresponding signals wires of the cable 152. Each cable assembly 180 also includes a ground shield 188 providing shielding for the signal contacts 186. In an exemplary embodiment, the ground shield 188 peripherally surrounds the signal contacts 186 along the entire length of the signal contacts 186 to ensure that the signal paths are electrically shielded from interference.

The support body 182 provides support for the cable assemblies 180. The cables 152 extend into the support body 182 such that the support body 182 supports a portion of the cables 152. The support body 182 may provide strain relief for the cables 152. Optionally, the support body 182 may be manufactured from a plastic material. Alternatively, the support body 182 may be manufactured from a metal material. The support body 182 may be a metalized plastic material to provide additional shielding for the cables 152 and the cable assemblies 180. Optionally, the support body 182 may include a metal plate electrically connected to each ground shield to electrically common each ground shield 188 and a dielectric overmold overmolded around the cables 106 and portions of the metal plate to support the cables 152 and cable assemblies 180.

Multiple contact modules 162 are loaded into the header housing 160. The header housing 160 holds the contact modules 162 in parallel such that the cable assemblies 180 are aligned in a column. Any number of contact modules 162 may be held by the header housing 160 depending on the particular application. When the contact modules 162 are stacked in the header housing 160, the cable assemblies 180 may also be aligned in rows.

Figure 5:
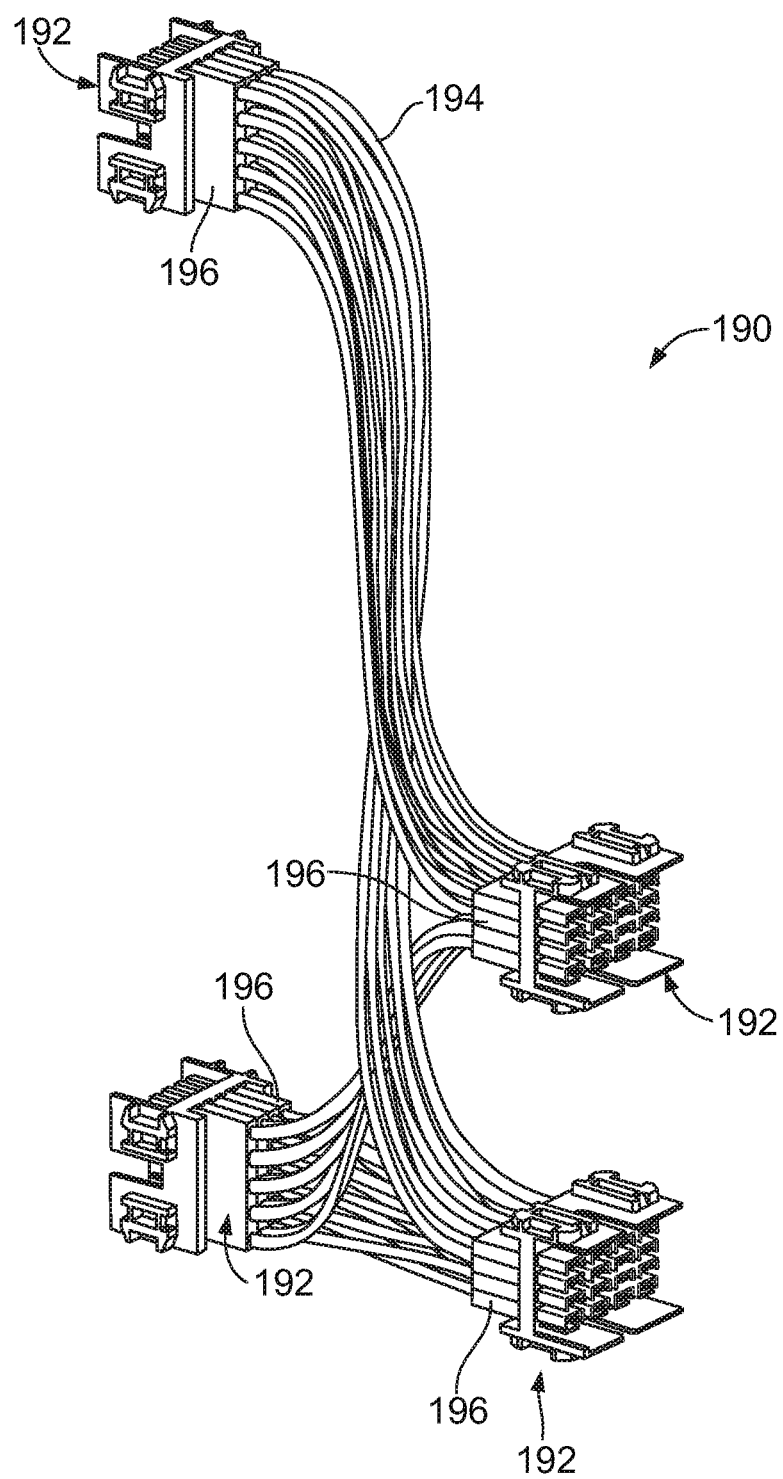
FIG. 5 illustrates a cable connector assembly formed in accordance with an exemplary embodiment.

FIG. 5 illustrates a cable connector assembly 190 formed in accordance with an exemplary embodiment. The cable connector assembly 190 is similar to the cable connector assembly 106 (shown in FIG. 4); however the cable connector assembly 190 includes more cable connectors 192 (e.g. four cable connectors 192 are shown in the embodiment illustrated in FIG. 5). Some of the cable connectors 192 may be used to interconnect with receptacle or card connectors 134 associated with the switch card 104 (both shown in FIG. 1), such as the bottom two cable connectors 192, while other cable connectors 192 may be used to interconnect with receptacle or card connectors 132 associated with the line card 102 (both shown in FIG. 1). Optionally, cables 194 from the same cable connector 192, such as cables from different contact modules 196, may be routed to several other cable connectors 192.

Figure 6:
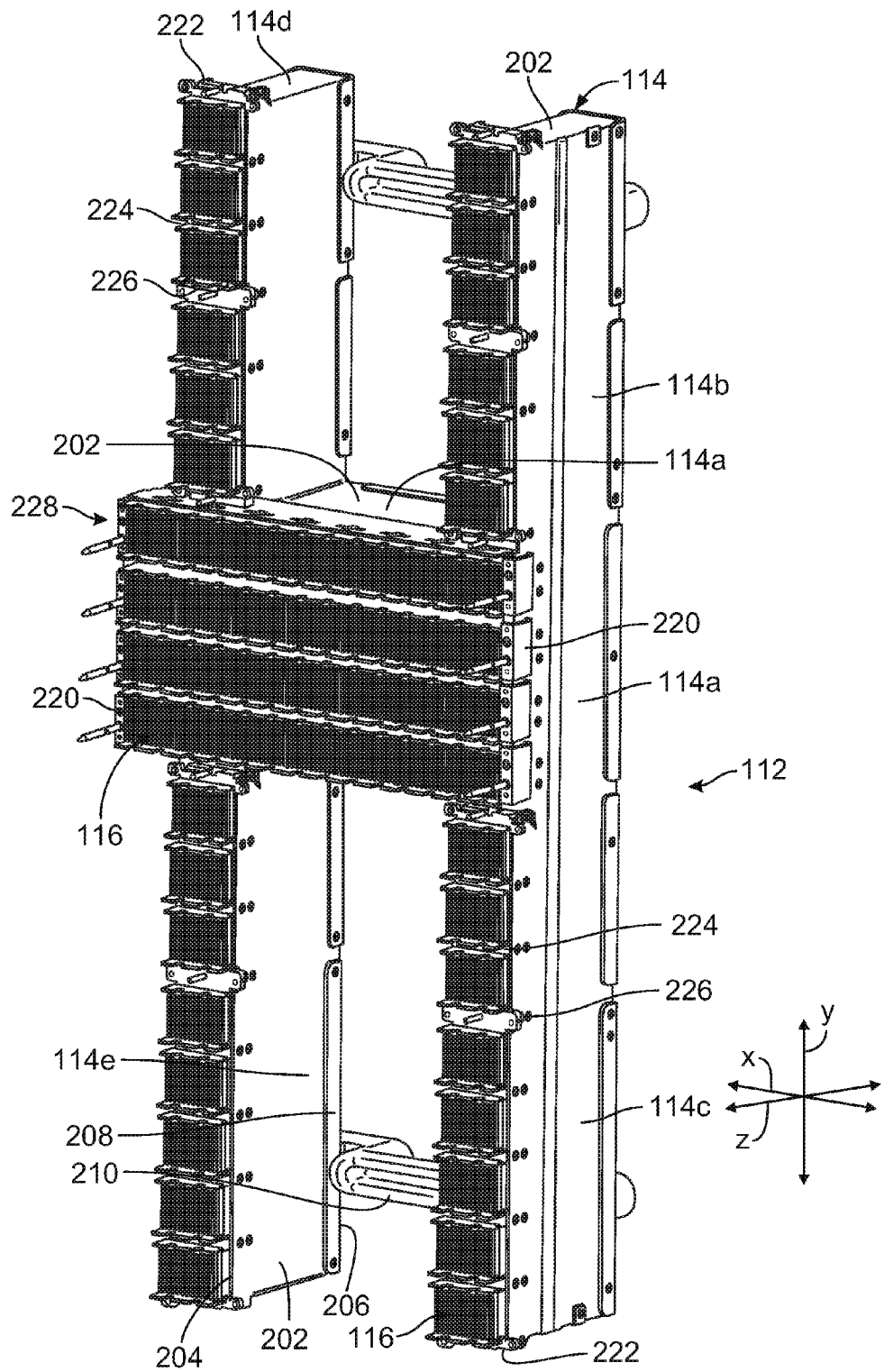
FIG. 6 illustrates a cable rack of the cable backplane system and formed in accordance with an exemplary embodiment.

FIG. 6 illustrates the cable rack 112. The cable rack 112 includes one or more trays 114 connected together to form the cable rack 112. In the illustrated embodiment, the cable rack 112 includes five trays 114a, 114b, 114c, 114d and 114e; however any number of trays 114 may be used in alternative embodiments. The trays 114 are coupled together into an H-shaped configuration having the first tray 114a at a central location with the other trays 114b, 114c, 114d, 114e extending outward from the first tray 114a as legs. The cable rack 112 may have other shapes in alternative embodiments.

In an exemplary embodiment, the first tray 114a is used to hold the cable connectors 116 that are mated with the card connectors 134 of the switch cards 104 (both shown in FIG. 1). The cable connectors 116 in the first tray 114a may be held together as a brick 228. The cable connectors 116 of each brick 228 are connected to the card connectors 134 of the same switch card 104. The other trays 114b, 114c, 114d, 114e are used to hold the cable connectors 116 that are mated with the card connectors 132 of the line cards 102 (both shown in FIG. 1). Optionally, the cable connectors 116 aligned at the same vertical position but in different trays (e.g. 114b and 114d or 114c and 114e) are connected to the card connectors 132 of the same line card 102.

Each tray 114 includes a frame 200 surrounding a raceway through which the cables 152 (shown in FIG. 4) are routed. The raceways are open to one another to allow the cables 152 to be routed from one tray 114 into another tray 114. The frame 200 includes side walls 202 extending between a front edge 204 and a rear 206 of the tray 114. A back wall 208 covers the raceway at the rear 206. The frame 200 is open at the front edge 204 between the side walls 202 to receive the cable connectors 116 therein.

In an exemplary embodiment, the side walls 202 and back wall 208 are sheet metal pieces that are stamped, formed and coupled together, such as using fasteners or other connecting means. The sheet metal may be thin enough to allow the frame 200 to have some flexibility for moving, twisting or otherwise manipulating the trays 114 into position relative to the backplane 120 (shown in FIG. 3) to position the cable connectors 116 in the openings 126 (shown in FIG. 3) in the backplane 120. Optionally, the trays 114 may be connected to each other with some freedom of movement or float built in to the connection to allow the trays 114 to move relative to one another to properly align the cable connectors 116 with the openings 126 in the backplane 120.

In an exemplary embodiment, the cable rack 112 includes handles 210 used to hold the trays 114 together. The handles 210 may be used to pick up the cable rack 112 and load the cable rack 112 onto the backplane 120 during assembly. Because of the size of the cable rack 112, assembly and loading of the cable connectors 116 and/or front edge 204 of the frame 200 into the openings 126 may be difficult. The handles 210 make moving of the cable rack 112 easier. The handles 210 may be removable once the cable rack 112 is coupled to the backplane 120.

The cable rack 112 includes a plurality of spacers 220, 222, 224, 226 used to hold positions of the cable connectors 116. The spacers 220, 222, 224, 226 may be different types of spacers. The spacers 220, 222, 224, 226 may have different sizes, shapes and/or features, such as guide pins. The spacers 220, 222, 224, 226 generally have similar functions, such as supporting one or more cable connectors 116.

In the illustrated embodiment, the spacers 220 are provided along sides of corresponding bricks 228 of cable connectors 116 that are located in the tray 114a. The bricks 228 are a group of cable connectors 116 that are held together in a stacked arrangement for mating with a plurality of the card connectors 134 of the same switch card 104 (both shown in FIG. 1). The spacers 220 may be referred to hereinafter as side spacers 220 or brick spacers 220. The spacers 222 are provided at ends of the trays 114b, 114c, 114d, 114e, such as to support the end-most cable connectors 116 in such trays 114. The spacers 222 may be referred to hereinafter as end spacers 222. The end spacers 222 are provided at the top and bottom ends of the cable rack 112. The end spacers 222 support a single cable connector 116. The spacers 224 are provided between adjacent cable connectors 116. The spacers 224 may be referred to hereinafter as intermediate spacers 224. The spacers 224 each support two cable connectors 116. The spacers 226 are provided between adjacent cable connectors 116, similar to the intermediate spacers 224; however the spacers 226 have guide pins extending therefrom, which may be used for guiding the cable rack 112 into alignment and engagement with the backplane 120. The spacers 226 may be referred to hereinafter as guide spacers 226.

In an exemplary embodiment, the cable connectors 116 are movable relative to the spacers 220, 222, 224, 226 to allow the cable connectors 116 to align with the corresponding openings 126 during assembly of the cable rack 112 and backplane 120. For example, the spacers 220, 222, 224, 226 may allow X, Y and/or Z float to allow fine alignment of the cable connectors 116 with the openings 126. Once the cable connectors 116 are positioned in the openings 126, the spacers 220, 222, 224, 226 may be fixed to the mounting blocks 142 (shown in FIG. 3), such as using fasteners to securely couple the cable rack 112 to the backplane 120 with the cable connectors 116 generally in position for mating with the corresponding card connectors 132, 134. In an exemplary embodiment, the cable connectors 116 are configured to float within the openings 126 relative to the spacers 220, 222, 224, 226 to obtain a true position for aligning to and mating with the corresponding card connectors 132, 134.

Figure 7:
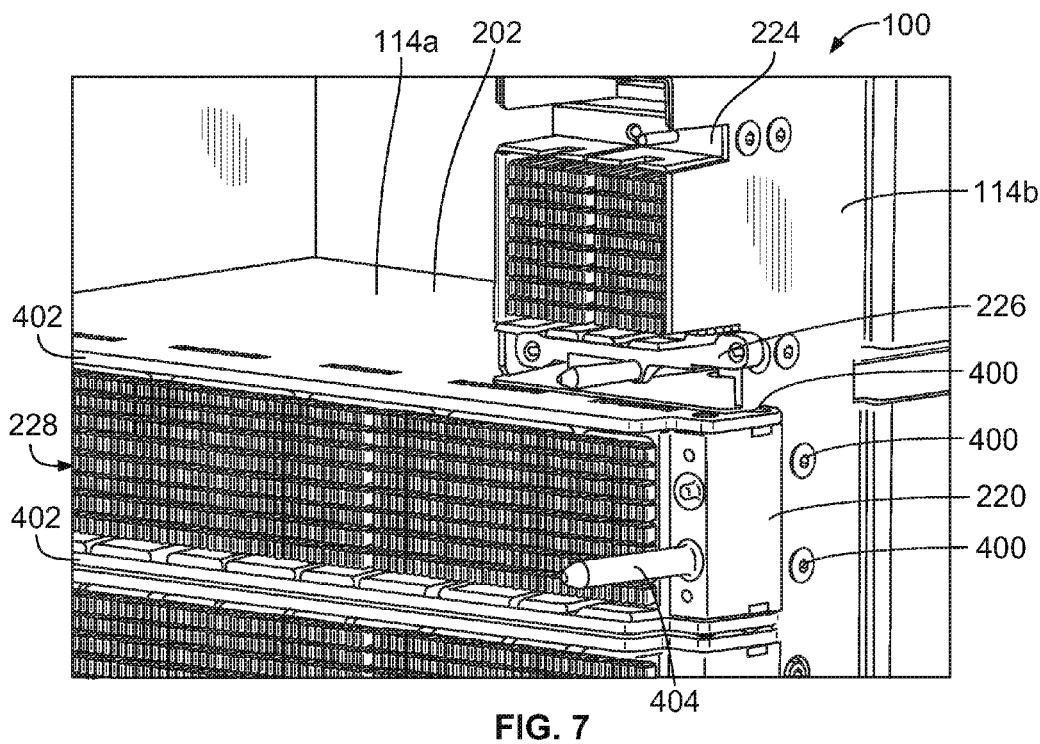
FIG. 7 is a front view of a portion of the cable backplane system.

FIG. 7 is a front view of a portion of the cable backplane system 100. FIG. 7 illustrates the trays 114a, 114b showing the spacers 220, 224, 226 used for mounting the trays 114 to the backplane 120 (shown in FIG. 1). FIG. 7 illustrates the side spacers 220 coupled to the bricks 228, forming part of the first tray 114a. Each brick 228 includes plates 402, which may be top and bottom plates extending along tops and bottoms of the cable connectors 116. The plates 402 hold the cable connectors 116 of the brick 228. The plates 402 may form parts of the side walls 202 of the tray 114a. The side spacers 220 are positioned between the plates 402.

The side spacers 220 are configured to be coupled to corresponding mounting blocks 142 (shown in FIG. 3) on the backplane 120 (shown in FIG. 1). The mounting blocks 142 secure the side spacers 220 in place relative to the backplane 120. However, the side spacers 220 are coupled to the plates 402, and thus the first tray 114a, using float mechanisms 400. The float mechanisms 400 allow movement in mutually perpendicular X, Y and/or Z directions. The side spacers 220 are movable relative to the plates 402 using the float mechanisms 400 to properly position the cable connectors 116 relative to the backplane 120.

In an exemplary embodiment, the first tray 114a is secured to the second tray 114b using float mechanisms 400. The float mechanisms 400 are used to couple the side spacers 220 to the second tray 114a. The side spacers 220 are movable relative to the second tray 114b using corresponding float mechanisms 400. The first and second trays 114a, 114b are movable relative to one another using the float mechanisms 400. The other trays 114 may be connected together in a similar manner using similar types of float mechanisms 400. In an exemplary embodiment, the removable dust caps 600 (shown in FIG. 8) are used during assembly to guide the trays 114 and cable connectors 116 into the openings 126 in the backplane 120. The dust caps 600 may also be used to align guide pins 404 of the side spacers 220 with corresponding guide holes 144 (shown in FIG. 3) in the backplane 120.

In an exemplary embodiment, the float mechanism 400 is a fastener such as a countersink screw. The float mechanisms 400 may be fasteners that are received in oversized holes or apertures in the trays 114 that allow the float mechanisms 400 to move in one or more mutually perpendicular directions relative to the trays 114. A circumferential gap may be defined around the float mechanism 400 in the aperture in the side wall 202 allowing the float mechanism 400 to move within the aperture. The size of the gap defines the amount of float. Optionally, the gap may allow approximately 1.0 mm of float in the X, Y and Z directions; however the gap may allow more or less float in alternative embodiments. Other types of float mechanisms may be used in alternative embodiments that tie the trays 114 together but allow limited relative movement therebetween. The float mechanisms 400 work with the guide features, such as the dust caps 600 and guide pins 404 to align the trays 114 and cable connectors 116 with the backplane 120.

Figure 8:
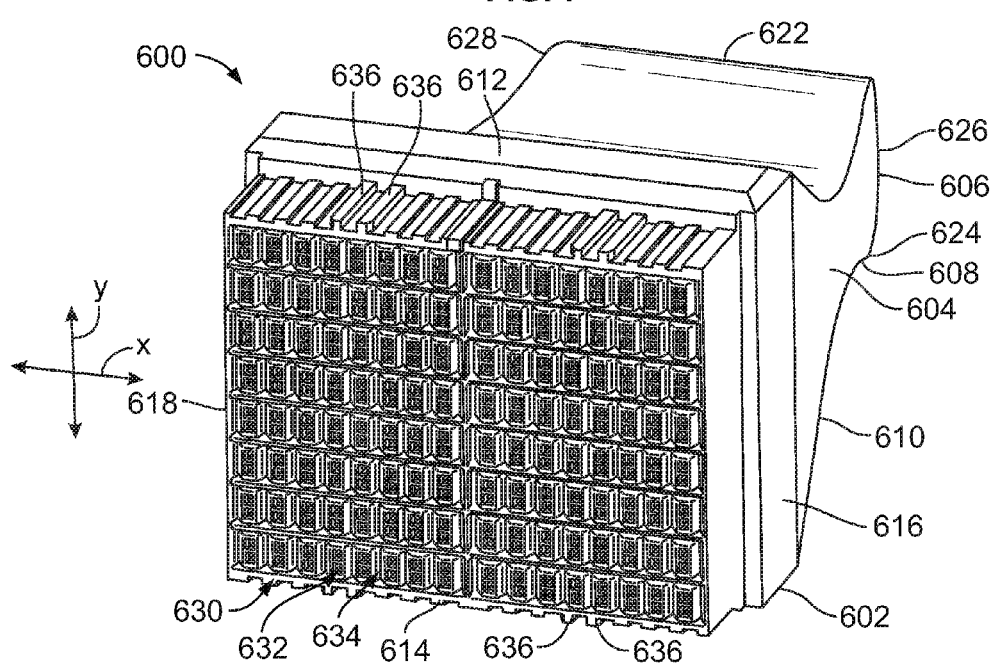
FIG. 8 is a front perspective view of a removable dust cap for the cable backplane system.
Figure 9:
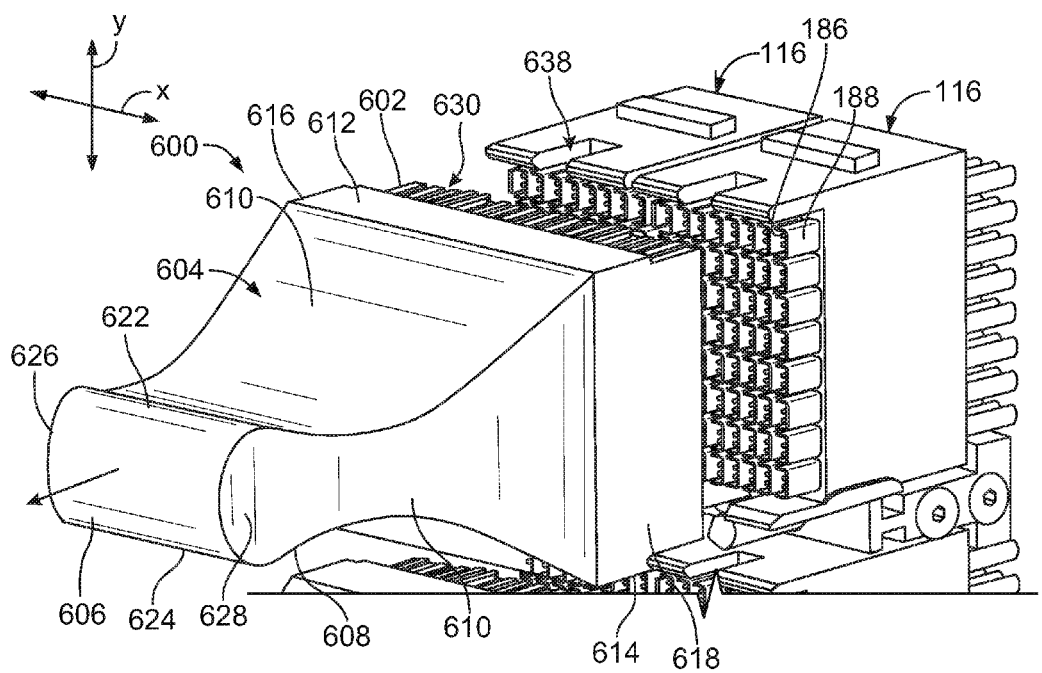
FIG. 9 illustrates the removable dust cap being removed from corresponding cable connectors.

FIG. 8 is a front perspective view of the removable dust cap 600. FIG. 9 illustrates the removable dust cap 600 being removed from corresponding cable connectors 116. In the illustrated embodiment, the dust cap 600 is configured to be coupled to two cable connectors 116, however the dust cap 600 may be designed to mate with greater or fewer cable connectors 116 in alternative embodiments.

The removable dust cap 600 is used to protect the cable connectors 116 during handling, such as during shipping, assembly, and the like. For example, the dust cap 600 protects the signal contacts 186 and the ground shield 188. The removable dust cap 600 may be used as a guide feature. The dust cap 600 guides the cable rack 112 during assembly to the backplane 120 (shown in FIG. 3). For example, as the cable rack 112 is brought into position from a rear of the backplane 120, the dust caps 600 are received in corresponding openings 126 (shown in FIG. 3) in the backplane 120. As the cable rack 112 is further loaded into the backplane 120, the dust caps 600 force the cable rack 112 into proper position relative to the backplane 120, if out of position, to guide the cable connectors 116 into the openings 126. The dust caps 600 may align other guide features, such as the guide pins 404 (shown in FIG. 7) with the holes 144 (shown in FIG. 3) in the backplane 120.

The removable dust cap 600 includes a base 602 and a handle 604 extending from the base 602 to a distal end 606. The handle 604 is shaped to allow a user to pull the dust cap 600 off of the cable connectors 116. For example, the handle 604 includes a rear facing grasping surface 608 that allows the dust cap 600 to be grasped by a user and pulled away from the cable connectors 116 to remove the dust cap 600.

Tapered guide walls 610 extend between the base 602 and the distal end 606. The guide walls 610 are used to guide assembly of the cable rack 112 and cable connectors 116 to the backplane 120. The guide walls 610 are tapered to force the dust cap 600 into proper position within the opening 126 in the backplane 120 during assembly. Optionally, the guide walls 610 may be curved. Alternatively, the guide walls 610 may be angled.

In an exemplary embodiment, the base 602 is rectangular and includes planar walls, including a top 612, a bottom 614, a first side 616 and a second side 618. The distal end 606 is smaller than the base 602 allowing the distal end 606 to be received in the opening 126 even in an incorrect or offset position. However, as the dust cap 600 is loaded into the opening 126, the guide walls 610 will force the dust cap 600 into the correct position (e.g. correct X and Y alignment) within the opening 126. The distal end 606 similarly includes a top 622, bottom 624, first side 626 and second side 628 that are each offset interior of the top 612, the bottom 614, the first side 616 and the second side 618, respectively. The guide walls 610 provide lead-in to the top 612, lead-in to the bottom 614, lead-in to the first side 616 and lead-in to the second side 618.

The dust cap 600, at the base 602, includes a mating end 630 that is mated with the cable connectors 116. The dust cap 600 includes signal contact openings 632 and ground shield openings 634 (both shown in FIG. 8) having a complementary pattern as the signal contacts 186 and ground shields 188 (both shown in FIG. 9). The dust cap 600 is coupled to the cable connectors 116 such that the signal contacts 186 are received in corresponding signal contact openings 632 and the ground shields 188 are received in corresponding ground shield openings 634. The dust cap 600 includes guide ribs 636 on the top 612 and the bottom 614 that are received in corresponding guide slots 638 in the housing 160 of the cable connectors 116.

Figure 10:
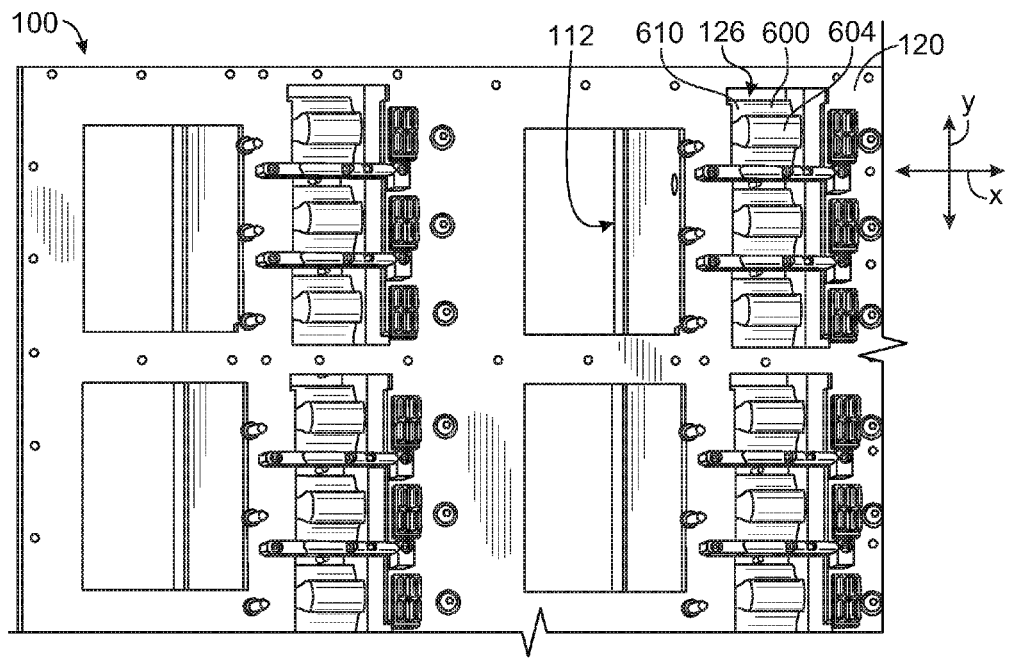
FIG. 10 illustrates a portion of the cable backplane system showing the cable rack with dust caps mounted thereto being assembled to the backplane.

FIG. 10 illustrates a portion of the cable backplane system 100, showing the cable rack 112, with dust caps 600 mounted thereto, being assembled to the backplane 120. During assembly, as the cable rack 112 is coupled to the backplane 120, the distal ends 606 of the dust caps 600 are loaded into corresponding openings 126 in the backplane 120. The guide walls 610 guide loading of the dust caps 600 into the openings 126. The dust caps 600 may interfere with the backplane 120 in the openings 126, causing the dust caps 600 to be shifted (e.g. up, down, left and/or right) within the openings 126 to align the cable rack 112 with the backplane 120. In an exemplary embodiment, the dust caps 600 provide guidance in at least two mutually perpendicular directions (e.g. X and Y directions).

Figure 11:
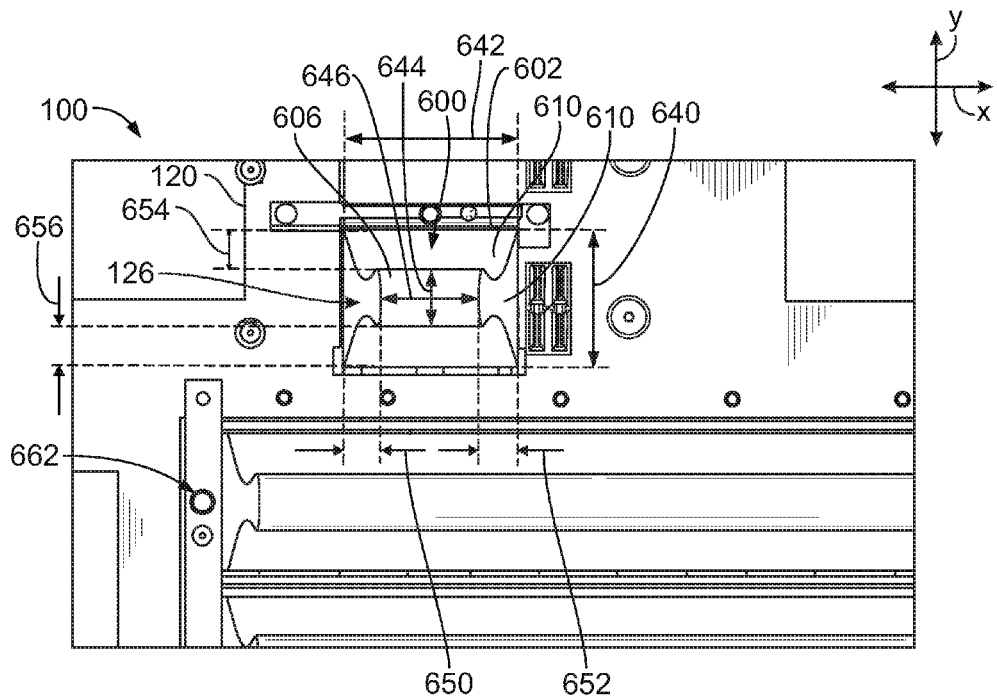
FIG. 11 is a front view of a portion of the cable backplane system showing the dust caps positioned in corresponding openings of the backplane.

FIG. 11 is a front view of a portion of the cable backplane system 100, showing the dust caps 600 positioned in the corresponding openings 126 of the backplane 120. As illustrated in FIG. 11, the size and shape of the base 602 is approximately the same as the size and shape of the opening 126. When the base 602 is received in the opening 126, the cable connector 116 (shown in FIG. 9) associated with the dust cap 600 is closely aligned with the opening 126. As noted above, the cable connector 116 may have some float relative to the tray 114 and the spacers 220, 222, 224, 226 (shown in FIG. 6) to accurately position the cable connector 116 within the opening 126; however the dust cap 600 provides good coarse alignment of the cable connector 116 with the opening 126 during assembly.

The base 602 has a height 640 and a width 642. The distal end 606 has a height 644 and a width 646 that are shorter and narrower than the height 640 and the width 642, respectively, of the base 602. The guide walls 610 are tapered between the base 602 and the distal end 606. In the illustrated embodiment, the handle 604 is bulb-shaped such that the handle 604 gets slightly wider, narrower, then wider along the guide walls 610. The guide walls 610 are tapered outward from the narrow, inner portion of the bulb to the base 602. Reference to the distal end 606 includes reference to the bulb shaped portion and/or the tip of the handle 604. FIG. 11 illustrates a generous amount of side-to-side lead-in (e.g. X lead-in) 650, 652 between the sides 616, 626 (shown in FIG. 8) and between the sides 616, 628 (shown in FIG. 8). FIG. 11 illustrates a generous amount of top-to-bottom lead-in (e.g. Y lead-in) 654, 656 between the tops 612, 622 (shown in FIG. 8) and the bottoms 614, 624 (shown in FIG. 8). The lead-in provided between the distal end 606 and the base 602 drives alignment of the cable connectors 116 with the openings 126 in the backplane 120 during assembly. The dust caps 600 simplify assembly of the cable backplane system 100.

Figure 12:
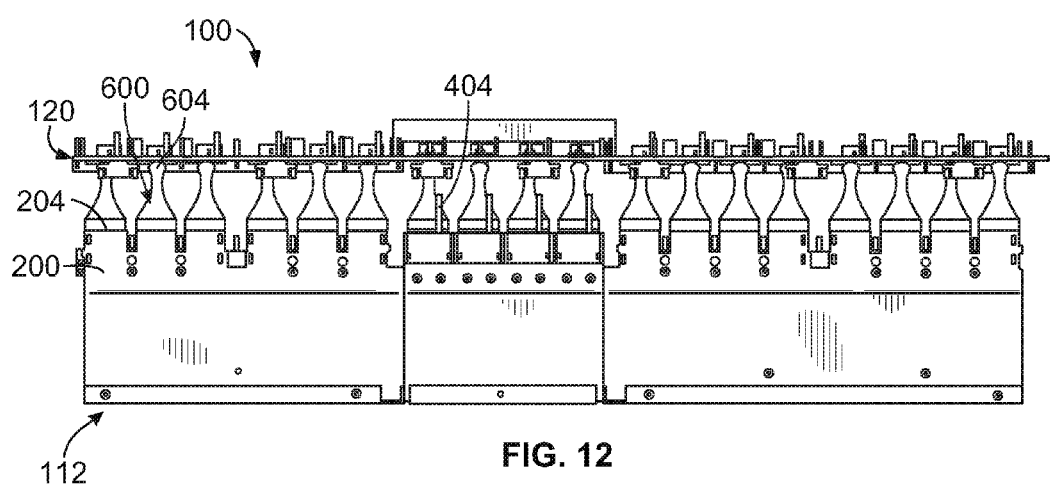
FIG. 12 is a side view of the cable backplane system showing the cable rack being coupled to the backplane at an initial stage of assembly.

FIG. 12 is a side view of the cable backplane system 100 showing the cable rack 112 being coupled to the backplane 120 at an initial stage of assembly. During assembly, the distal ends 606 of the dust caps 600 protrude further than other components of the cable rack 112. For example, the distal ends 606 of the dust caps 600 are positioned a first distance from a front edge 204 of the frame 200, which is a further distance than the guide pins 404, to allow the dust caps 600 to provide alignment for the guide pins 404. The distal ends 606 of the dust caps 600 are the first guide features of the cable rack 112 that mate with the backplane 120. Because the distal ends 606 are much smaller than the openings 126 (shown in FIG. 11) of the backplane 120, the distal ends 606 are easily loaded into the openings 126 without needing to be precisely aligned.

Figure 13:
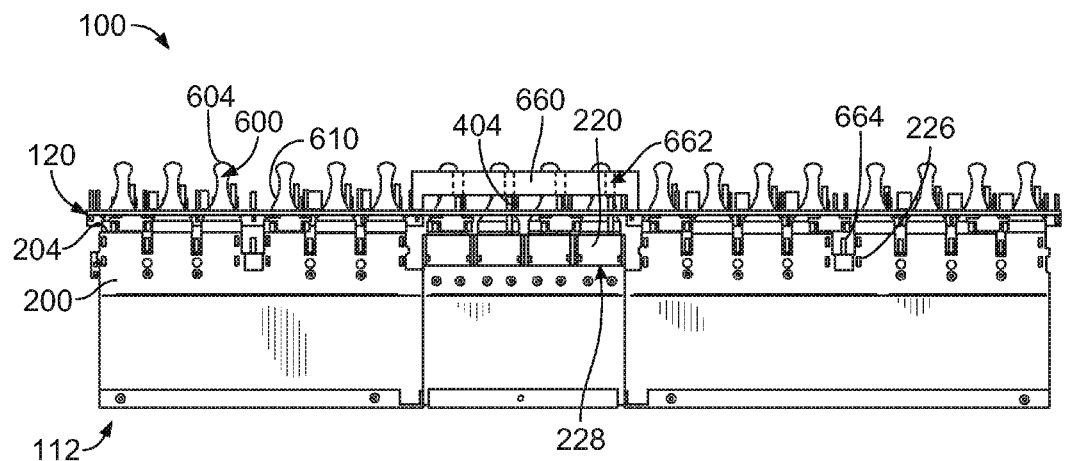
FIG. 13 is a side view of the cable backplane system showing the cable rack being coupled to the backplane at an intermediate stage of assembly.

FIG. 13 is a side view of the cable backplane system 100 showing the cable rack 112 being coupled to the backplane 120 at an intermediate stage of assembly. The dust caps 600 are shown partially loaded through the openings 126 (shown in FIG. 11) in the backplane 120 in FIG. 13. The guide walls 610 are shown passing through the backplane 120. When the wider portion of the dust cap 600 begins to pass through the backplane 120, the dust caps 600 are forced into proper alignment (e.g. X and/or Y alignment) within the openings 126. The dust caps 600 begin to center within the openings 126 if the dust caps 600 are offset.

The dust caps 600 are used to align the cable rack 112 such that the guide pins 404 are aligned with the backplane 120 and a corresponding mounting block 660 mounted to the backplane 120. The mounting block 660 extends vertically along the front of the backplane 120. The mounting block 660 includes openings 662 (shown in phantom in FIG. 13, also illustrated for reference in FIG. 11) that receive the guide pins 404 of the side spacers 220. The guide pins 404 are tapered at the tip to ensure that the guide pins 404 enter the openings 662 and to accommodate for offset and/or misalignment. The guide pins 404 are used to more precisely align the cable rack 112 with the backplane 120 as compared to the dust caps 600. The guide pins 404 align the bricks 228 with the backplane 120. The guide pins 404 are configured to engage the mounting block 660 prior to guide pins 664 of the guide spacers 226 engaging the backplane 120. The tips of the guide pins 404 are located a further distance from the front edge 204 of the frame 200 than the tips of the guide pins 664. The guide pins 404 are used to align the bricks 228 to the backplane 120 prior to the guide pins 664 aligning to the backplane 120.

Figure 14:
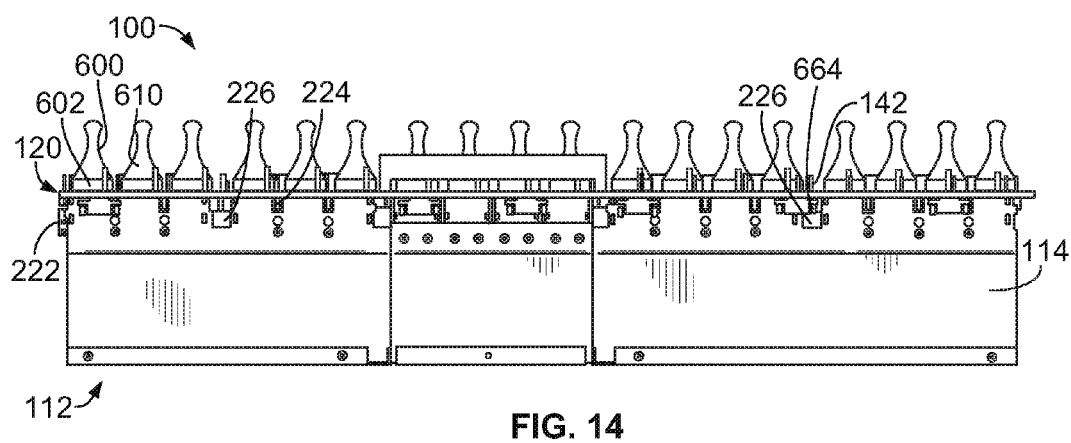
FIG. 14 is a side view of the cable backplane system showing the cable rack coupled to the backplane at a final stage of assembly.

FIG. 14 is a side view of the cable backplane system 100 showing the cable rack 112 coupled to the backplane 120 at a final stage of assembly. The bases 602 of the dust caps 600 are disposed within the openings 126 (shown in FIG. 11) in the backplane 120. The guide walls 610 are no longer affecting the alignment of the dust caps 600, but rather, the bases 602 position the cable connectors 116 (shown in FIG. 9) with enough accuracy that the guide pins 664 of the guide spacers 226 are aligned with the corresponding guide holes 144 (shown in FIG. 3) of the backplane 120. The guide pins 664 are tapered at the tip to ensure that the guide pins 664 enter the guide holes 144 and to accommodate for offset and/or misalignment. As the guide pins 664 are loaded into the guide holes 144 in the backplane 120, the guide pins 664 may further align the spacers 226, and thus the cable connectors 116 held by the spacers 226, with the backplane 120.

Once the guide pins 664 are loaded through the backplane 120 and into the mounting blocks 142, the spacers 226 and trays 114 are fixed relative to the backplane 120. The mounting blocks 142 may be secured to the spacers 222, 224, 226, such as using threaded fasteners, to tie the components together with the backplane 120 sandwiched therebetween. In an exemplary embodiment, the cable connectors 110 are able to float relative to the spacers 226 to allow for precise alignment of the cable connectors 116 with the card connectors 132 (shown in FIG. 1) during mating. Once the cable rack 112 is mounted and secured to the backplane 120, the dust caps 600 may be removed and the card connectors 132 may be coupled to the cable connectors 116.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A cable backplane system comprising:
   a backplane having a plurality of openings therethrough and a plurality of mounting blocks on a front of the backplane, the backplane having guide holes proximate to the openings;
   a cable rack coupled to a rear of the backplane, the cable rack comprising:
   a tray having a frame surrounding a raceway;
   spacers coupled to the tray, the spacers having guide pins received in corresponding guide holes in the backplane;
   cable connector assemblies held by the tray, each cable connector assembly having a plurality of cables extending between at least two cable connectors, the cables being routed in the raceway, the cable connectors positioned between and supported by corresponding spacers on opposite sides of the cable connectors, the cable connectors being received in corresponding openings in the backplane; and
   removable dust caps coupled to corresponding cable connectors, the removable dust caps each having a distal end and guide walls extending from the distal end, the guide walls guiding mating of the cable rack with the backplane, the distal end of each dust cap being received in a corresponding opening in the backplane, the guide walls guiding the cable rack relative to the backplane such that the guide pins of the spacers are aligned with the guide holes of the backplane and such that the cable connectors are aligned with the openings of the backplane;
   wherein the removable dust caps are removed after the cable rack is coupled to the backplane.

2. The cable backplane system of claim 1, wherein the dust caps cover mating ends of the cable connectors to protect the cable connectors during mating.

3. The cable backplane system of claim 1, wherein the cable connectors comprise cable assemblies including signal contacts and ground shields, the dust caps comprising signal contact openings and ground shield openings, the dust caps being coupled to the cable connectors such that the signal contacts are received in corresponding signal contact openings and the ground shields are received in corresponding ground shield openings.

4. The cable backplane system of claim 1, wherein each dust cap includes a base opposite the distal end, the base being coupled to the corresponding cable connector, the guide walls being tapered between the base and the distal end.

5. The cable backplane system of claim 1, wherein each dust cap includes a base opposite the distal end, the base being coupled to the corresponding cable connector, the base having a height and a width, the distal end having a height and a width that are shorter and narrower than the height and the width of the base, the guide walls tapered between the base and the distal end.

6. The cable backplane system of claim 1, wherein each dust cap includes a base opposite the distal end, the base being coupled to the corresponding cable connector, the base includes a top, a bottom, a first side and a second side, the distal end being offset interior of the top, the bottom, the first side and the second side such that the guide walls provide lead-in to the top, lead-in to the bottom, lead-in to the first side and lead-in to the second side.

7. The cable backplane system of claim 1, wherein each dust cap comprises a base coupled to the corresponding cable connector and a handle extending from the base to the distal end, the handle having a grasping surface that allows the dust cap to be grasped by a user and pulled away from the backplane to remove the dust cap.

8. The cable backplane system of claim 1, wherein the distal ends are positioned a first distance from a front edge of the frame, tips of the guide pins being positioned a second distance from the front edge of the frame, the second distance being less than the first distance, the guide walls being oriented to ensure the guide pins are aligned with the guide holes.

9. The cable backplane system of claim 1, wherein the guide walls provide coarse alignment of the cable rack with respect to the backplane and the guide pins provide fine alignment of the cable rack with respect to the backplane.

10. The cable backplane system of claim 1, wherein the spacers are configured to float relative to the frame to allow limited movement in at least two mutually perpendicular directions of the cable connector relative to the backplane to allow the cable connectors to align with the openings.

11. The cable backplane system of claim 1, wherein the cable connectors are configured to float relative to the spacers to allow limited movement in at least two mutually perpendicular directions of the cable connectors relative to the backplane to allow the cable connectors to align with the openings after the spacers are fixed to the backplane.

12. The cable backplane system of claim 1, wherein the mounting blocks include openings configured to receive corresponding guide pins.

13. A cable rack for a cable backplane system comprising:
a tray having a frame surrounding a raceway;
spacers coupled to the tray, the spacers having guide pins configured to align the spacers to a backplane in guide holes of the backplane;
cable connector assemblies held by the tray, each cable connector assembly having a plurality of cables extending between at least two cable connectors, the cables being routed in the raceway, the cable connectors positioned between and supported by corresponding spacers on opposite sides of the cable connectors, the cable connectors being configured to be received in corresponding openings in the backplane; and
removable dust caps coupled to corresponding cable connectors, the removable dust caps each having a base and a handle extending from the base to a distal end with tapered guide walls extending between the base and the distal end, the guide walls guiding mating of the cable rack with the backplane, the removable dust caps being removable after the cable rack is coupled to the backplane.

14. The cable rack of claim 13, wherein the guide walls guide the cable rack relative to the backplane such that the guide pins of the spacers are aligned with the guide holes of the backplane and such that the cable connectors are aligned with the openings of the backplane.

15. The cable rack of claim 13, wherein the dust caps cover mating ends of the cable connectors to protect the cable connectors during assembly of the cable connector assemblies with the backplane.

16. The cable rack of claim 13, wherein the cable connectors comprise cable assemblies including signal contacts and ground shields, the dust caps comprising signal contact openings and ground shield openings, the dust caps being coupled to the cable connectors such that the signal contacts are received in corresponding signal contact openings and the ground shields are received in corresponding ground shield openings.

17. The cable rack of claim 13, wherein the base has a height and a width and the distal end has a height and a width that are shorter and narrower than the height and the width of the base, the guide walls being tapered between the base and the distal end.

18. The cable rack of claim 13, wherein the base of each dust cap includes a top, a bottom, a first side and a second side, the distal end being offset interior of the top, the bottom, the first side and the second side such that the guide walls provide lead-in to the top, lead-in to the bottom, lead-in to the first side and lead-in to the second side.

19. The cable rack of claim 13, wherein the spacers are configured to float relative to the frame to allow limited movement in at least two mutually perpendicular directions of the cable connector relative to the backplane to allow the cable connectors to align with the openings.

20. The cable rack of claim 13, wherein the cable connectors are configured to float relative to the spacers to allow limited movement in at least two mutually perpendicular directions of the cable connectors relative to the backplane to allow the cable connectors to align with the openings after the spacers are fixed to the backplane.

* * * * *